United States Patent [19]

Kim et al.

[11] Patent Number: 5,166,090
[45] Date of Patent: Nov. 24, 1992

[54] METHOD FOR MANUFACTURING A SEMICONDUCTOR RANDOM ACCESS MEMORY CELL

[75] Inventors: Kyong-Tae Kim; Yoon-Sung Shin, both of Seoul, Rep. of Korea

[73] Assignee: Samsung Electronics Co., Ltd., Suwon, Rep. of Korea

[21] Appl. No.: 639,778

[22] Filed: Dec. 14, 1990

Related U.S. Application Data

[63] Continuation of Ser. No. 359,146, May 31, 1989, abandoned.

[30] Foreign Application Priority Data

May 1, 1989 [KR] Rep. of Korea ............... 1989-5793

[51] Int. Cl.[5] ............................................... H01L 21/70
[52] U.S. Cl. ............................... 437/52; 437/47; 437/60; 437/191; 437/193; 437/233; 437/235; 437/919
[58] Field of Search ............... 437/47, 48, 52, 60, 437/228, 233, 235, 238, 919; 357/23.6

[56] References Cited

U.S. PATENT DOCUMENTS

| | | | |
|---|---|---|---|
| 4,641,166 | 2/1987 | Takemae | 357/51 |
| 4,700,457 | 10/1987 | Matsukawa | 437/52 |
| 4,882,289 | 11/1989 | Moriuchi et al. | 437/60 |
| 4,899,203 | 2/1990 | Ino | 357/23.6 |

FOREIGN PATENT DOCUMENTS 0163445 8/1985 Japan ............... 437/235
0094561 4/1990 Japan ............... 437/52

Primary Examiner—Tom Thomas
Attorney, Agent, or Firm—Robert E. Bushnell

[57] ABSTRACT

There is disclosed a method for easily manufacturing a semiconductor random access memory cell having a large stacked storage capacitance. The inventive subject, to attain the goal of the invention, includes steps of: forming a thick field oxide layer on a portion of the semiconductor surface; forming an N+ drain region on the semiconductor substrate surface; forming a gate oxide layer on the surface the drain, source and channel regions; forming a first conductive polycrystalline silicon layer on the upper portion channel region and a given portion of said field oxide layer, respectively; forming a first insulating layer, a first cell plate layer, a first dielectric layer, and a second polycrystalline silicon layer on a word line, the exposed gate oxide layer and the field oxide layer; forming a contact hole within the first insulating layer, the first cell plate layer, a first dielectric layer, and the second polycrystalline silicon layer on the drain region; forming a side wall-insulating layer defined to a side wall of said contact hole; forming a third polycrystalline silicon layer on the exposed source region and side-wall insulating layer; forming a second dielectric layer on a surface of the exposed cell node layer after removing the given portion of the first and second polycrystalline silicon layers; and forming a second cell plate of a fourth polycrystalline silicon layer on the upper portion of the second dielectric layer.

19 Claims, 3 Drawing Sheets

METHOD FOR MANUFACTURING A SEMICONDUCTOR RANDOM ACCESS MEMORY CELL

This is a Continuation of application Ser. No. 07/359,146, filed May 31, 1989 now abandoned.

BACKGROUND OF THE INVENTION

This invention relates to a method of manufacturing a semiconductor random access memory cell (DRAM cell), particularly, which has a large stacked storage capacity.

A DRAM cell includes a transistor of which a drain-source is connected between a bit line and cell node, and a storage capacitor connected between the cell node and a cell plate. The increment of memory capacity is in need of nearly constant and large storage capacity of the cell, and also reduction in size. In order to increase the cell storage capacity, capacitor cells formed with a three dimensional structure, such as a trench capacitor cell and a stacked capacitor cell, have been researched.

Whereas the trench capacitor cell has an advantage of large storage capacity, it is not necessarily easy to manufacture because of the problems like a punch-through and a leakage current between trenches. On the contrary, manufacturing the staked capacitor cell is easy to carry out, while it has been considered about the limitation of sufficiently large storage capacity. A method for increasing capacity of the stacked capacitor cell is connecting two capacitor cells in parallel between a cell node and a cell plate. Such prior art is disposed in the U.S. Pat. No. 4,735,915. In this prior art, however, it is difficult to achieve sufficient storage capacity because it can't provide a large surface area for the storage capacitor.

The other method for increasing capacity of the stacked capacitor is extending the area of storage capacity by forming multiple insulating layers between the cell node and the cell plate. Such a prior art is disclosed in "3-DIMENSIONAL STACKED CAPACITOR CELL FOR 16M AND 64M DRAMS" IEDM, issued in 1988, PP.592-595. This structure, however, has a difficulty in manufacturing.

SUMMARY OF THE INVENTION

An object of the current invention is to provide a method for easily manufacturing a stacked memory cell having a large storage capacitance. These and other objects are attained with a process including the steps of: forming a thick field oxide layer on a portion of a semiconductor surface; forming an N+ drain region on the semiconductor substrate surface; forming a gate oxide layer on the surface of the drain, source and channel regions; forming a first conductive polycrystalline silicon layer on the upper portion of the channel region and a given portion of the field oxide layer, respectively; forming a first insulating layer, first cell plate layer, a first electric layer, and a second polycrystalline silicon layer on a word line, exposed gate oxide layer and field oxide layer; forming a contact hole within the first insulating layer, the first cell plate layer, a first dielectric layer, and the second polycrystalline silicon layer on the drain region; forming a side wall-insulating layer defined to a side wall of the contact hole; forming a third polycrystalline silicon layer on the exposed source region and side-wall insulating layer; forming a second dielectric layer on surface of the exposed cell mode layer after removing the given portion of the first and second polycrystalline silicon layer; and forming a second cell plate of a fourth polycrystalline silicon layer on the upper portion of the second dielectric layer.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF PREFERRED EMBODIMENTS

Figure 1:
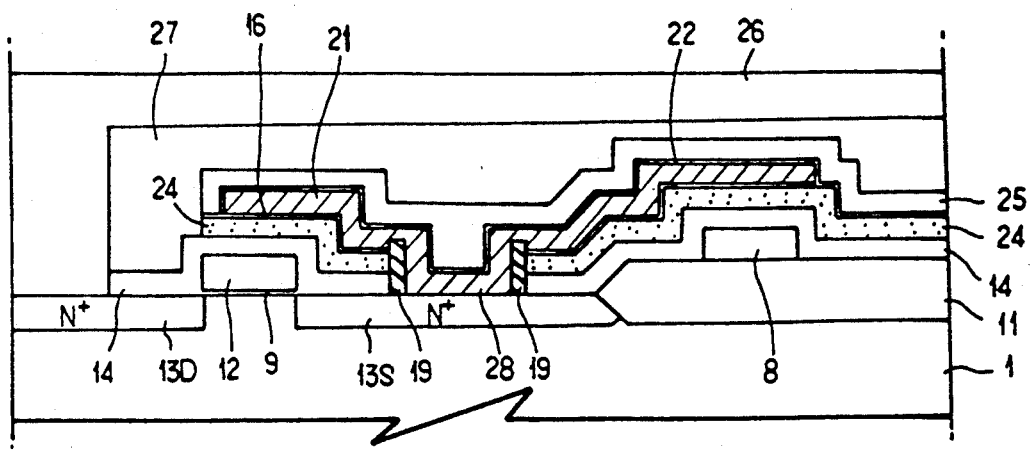
FIG. 1 is a sectional view showing an embodiment of a semiconductor stacked memory cell according to this invention.
Figure 2:
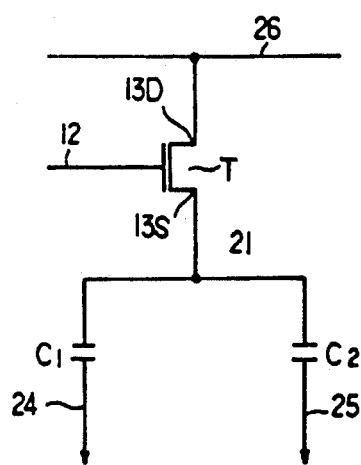
FIG. 2 is a circuit diagram showing an equivalent circuit of FIG. 1.

Note that the same reference numerals in the drawings represent the same elements and compositions. Referring to FIG. 1 and FIG. 2, a one-transistor semiconductor DRAM cell according to the present invention has: an n-channel MOS transistor including a drain region 13D and source region 13S formed on a p-type substrate 1, and a conductive word line layer 12 grown on a gate oxide layer 9 on the substrate 1 between the drain and source regions; and a first and second cell storage capacitor C1, C2 connected in parallel between a cell node layer 21 connected with the source region 13S and a first and second conductive cell plate layers 24, 25 which are connected to each other. The first capacitor C1 has a first thin dielectric layer 16 formed on the first cell plate layer 24 and the cell node layer 21. The second capacitor 2 has a second thin dielectric layer 22 formed on the cell node layer 21 and the second cell plate layer 25.

A reference numeral II represents a thick field oxide layer for isolating memory cells, and a adjacent word line layer 8 providing a gate electrode of a adjacent memory cell is formed on the oxide layer 11. The word line layers 12 and 8 are enclosed with an insulating layer 14. The drain region 13D is connected to a conductive bit line 26 through a contact hole, and the bit line 26 grows on a insulating layer 27 formed on the second cell plate layer 25. In order to insulate the first cell plate layer 24 from the cell node layer 21, a side wall insulating layer 19 is formed on the side wall of the contact hole 28 for connecting the source region 13S to the cell node layer 21.

Therefore, the memory cell structure as described above has sufficient capacity by the large surface area of the capacitors C1 and C2 connected in parallel between the cell node layer 21 and the first and the second cell plate layers 24, 25, and by the second dielectric layer 22 which is extending to the contact hole 28.

Figure 3A:
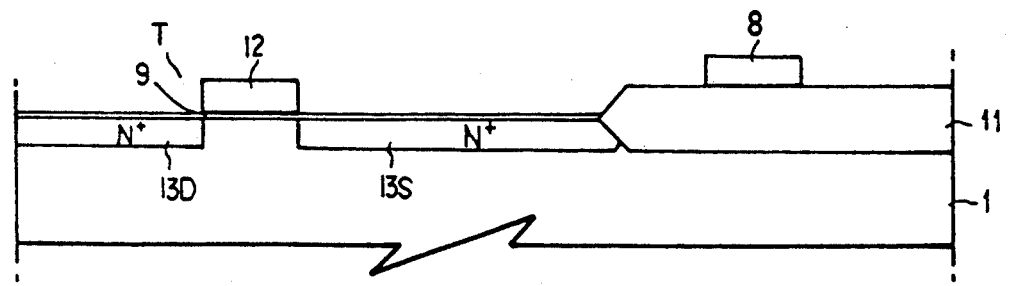
FIGS. 3(A) through 3(F) are sectional views showing successive steps of manufacturing semiconductor stacked memory cell according to this invention.

Referring now to FIG. 3A, the substrate 1 is p-type with a concentration of $10^{16}$ ion/cm$^3$. Note that it may be a p-type well grown on a p-type wafer with a sheet resistance of 18Ω-cm. A field oxide layer 11 for isolating memory cells from each other is formed on the substrate 1. Thereafter, a switching transistor having a drain 13D and source region 13S isolated from each other by a channel region, and a polycrystalline silicon gate electrode or word line 12 formed on a gate oxide film 9 of about 200 Å thick, is also formed. On the field oxide layer 11, adjacent word line 8 is formed, simultaneously, while the word line 12 is formed. The thickness of the word lines are about 3000 Å thick. Such a method for manufacturing n-channel switching transistors has been well known in the field of the art.

Figure 3B:
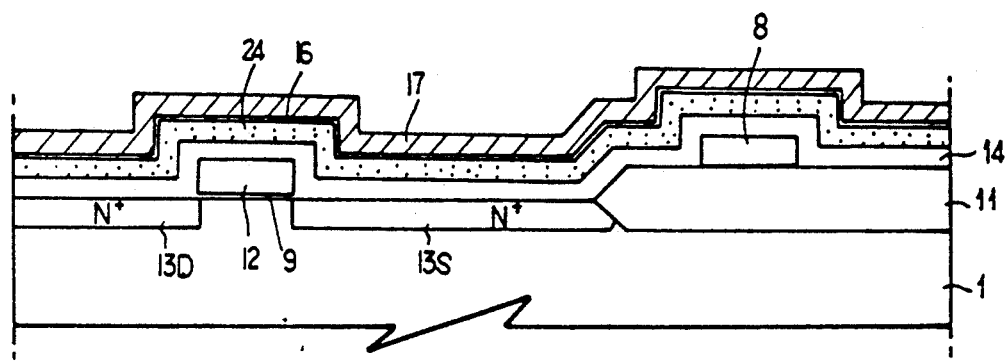
Figure 3C:
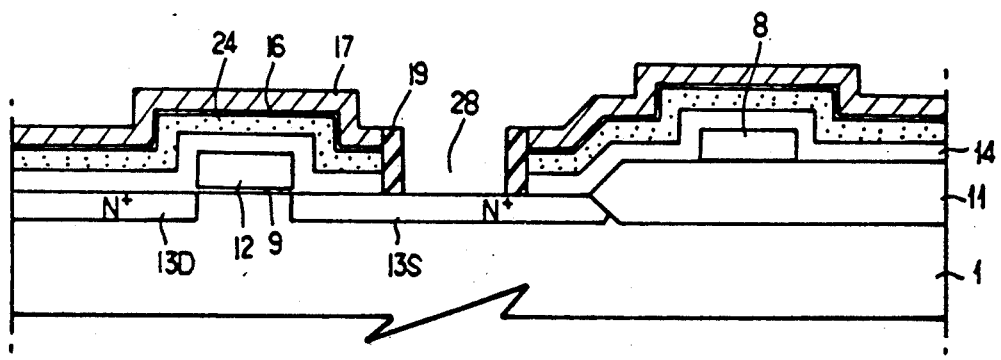

Then, as shown in FIG. 3B, an insulating layer 14, such as silicon oxide, of about 2500 Å is formed on the whole surface of the word lines 8, 12, the field oxide layer 11 and the exposed gate oxide layer 9, by a known CVD (Chemical Vapor Deposition). On the whole surface of the insulating layer 14, there is formed a sequence of the first cell plate layer 24 of polycrystalline silicon of which thickness is from 2000 Å to 3000 Å, and a sheet resistor has 100Ω/□; the first dielectric layer 16 is about 140 to 150 Å; a polycrystalline silicon layer 17 is about 1000 Å thick; the first dielectric layer 16 may be formed with silicon oxide of about 140 Å, silicon nitride (Si3N4) about 30 Å and silicon oxide about 30 Å. Thereafter, as shown in FIG. 3C, the contact hole 28 for connecting with the N+ source region 13S is formed.

Figure 3D:
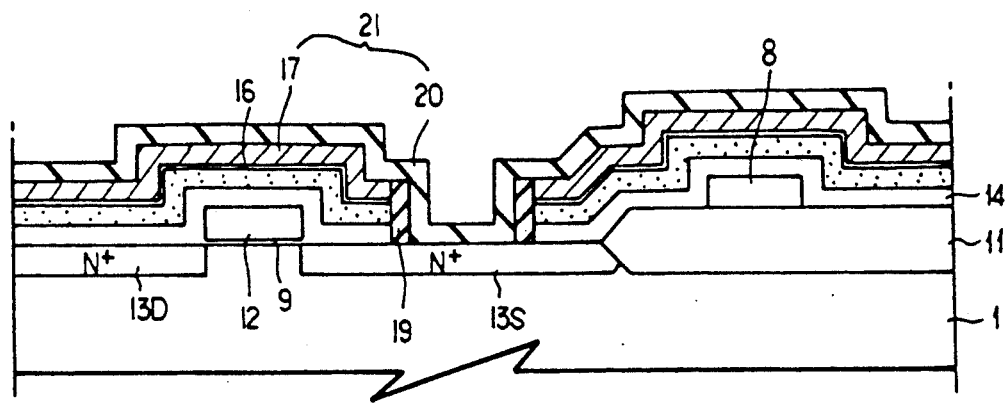

Thereafter, a SiO2 layer of about 1500 Å is formed on the entire surface of the polycrystalline silicon layer 17, the side wall of the contact hole 28 and the exposed N+ source region by a CVD method, and a side wall insulating layer 19 is formed by well known etch-back method. Note that polycrystalline silicon layer 17 is made for protecting the first thin insulating layer 16 from damage during the etch-back process. After removing the SiO2 layer on the polycrystalline silicon layer 17 and source region 13S by the etch-back process, a polycrystalline silicon layer 20 is formed on the exposed source region 13S, the side wall insulating layer 19 and the surface of the polycrystalline silicon layer 17 as shown in FIG. 3D. And then the polycrystalline silicon layers 17, 20 are doped with POC13 at about 100Ω/□. Therefore, the doped polycrystalline layers 17, 20 provide the cell storage node layer 21 connected to the source region 13S. The polycrystalline silicon layers 17, 20 may be doped with POC13, respectively.

Figure 3E:
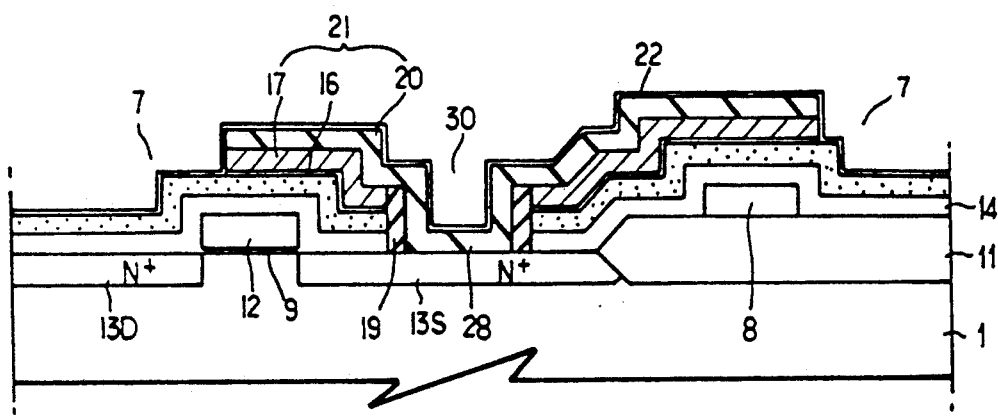

Next, as shown in FIG. 3E, a portion 7 of the polycrystalline silicon layers 17, 20 is eliminated in order to define the second dielectric layer 22. Hence, the second dielectric layer 22, which has substantially the same thickness and materials as those of the first dielectric layer, is formed on the polycrystalline silicon layer 20 and the surface of the portion 7.

Figure 3F:
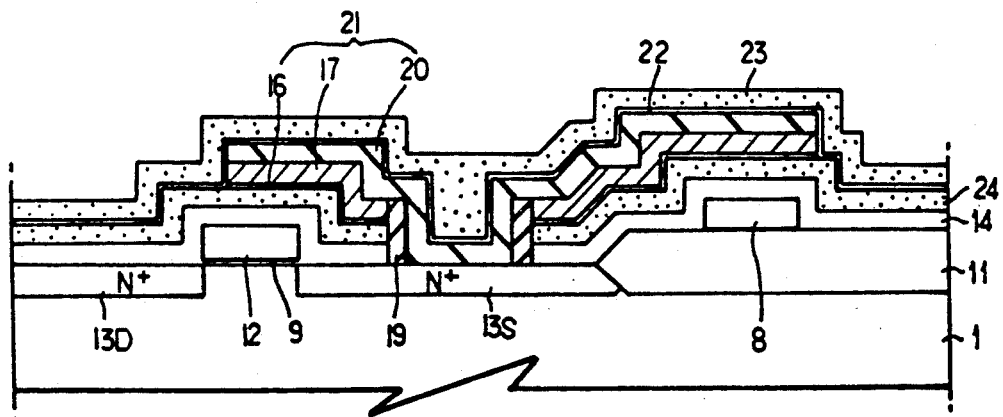

Therefore, it is expected that a large storage capacity can be achieved by rather large curvature because the second dielectric layer 22 extends on the trench region 30 of polycrystalline silicon layer 20 in the contact hole 28 and the step surface due to field oxide layer 11. And then, as shown in FIG. 3F, a doped polycrystalline silicon layer 23 of about 100Ω/□ is formed on the entire surface of the second insulating layer 22 to 2000 Å of thickness. Next, as shown in FIG. 1, the polycrystalline silicon layer 23 is selectively etched in order to form the second cell plate layer 25. Thereafter a SiO2 layer or BPSG (Boro-Phospho Silicate Glass) layer 27 is deposited by CVD method, and then a conductive bit line 26 is formed by an opening of the drain region 13D. It may be possible that the first and the second cell plates 24, 25 are connected with each other to have the same electric potential, or to have respectively different electric potential which equals that of the ground and the substrate bias.

The foregoing description shows described a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A method for manufacturing on a p-type semiconductor substrate a semiconductor random access memory cell having an n-type switching transistor and stacked storage capacitor, said method comprising the steps of:

forming a thick field oxide layer on a portion of the semiconductor surface;

forming an N+ drain region isolated with an N+ source region adjacent to the field oxide layer on said semiconductor substrate surface, said N+ source and drain regions being separated through a N channel region;

forming a gate oxide layer on the surface of said drain region, said source region and said channel region;

forming first and second word lines from a first conductive polycrystalline silicon layer on the upper portion of said channel region and a given portion of said field oxide layer, respectively;

forming a first insulating layer, a first cell plate layer, a first dielectric layer, and a second polycrystalline silicon layer on exposed surfaces of said word lines, said gate oxide layer and said field oxide layer;

forming a contact hole within the first insulating layer, the first cell plate layer the first dielectric layer, and the second polycrystalline silicon layer to expose a portion of said source region;

forming side wall-insulating layers defined by side walls of said contact hole;

forming a third polycrystalline silicon layer on said exposed portion of said source region and said side-wall insulating layers in order to connect said exposed portion of said source region with said second polycrystalline silicon layer;

forming a second dielectric layer on a surface of exposed portions of said first dielectric layer after removing portions of said second and third polycrystalline silicon layers, and on remaining and exposed portions of said second and third polycrystalline silicon layer in order to define a storage node from said second and third polycrystalline silicon layers; and forming a second cell plate layer of a fourth polycrystalline silicon layer on an upper portion of said second dielectric layer.

2. A method according to claim 1, wherein said first and second dielectric layers are formed of either three layers of silicon oxide, silicon nitride and silicon oxide, or two layers of silicon nitride and silicon oxide.

3. A method according to claim 1, wherein said first, second, third and fourth polycrystalline layers are small resistance-layers of approximately 100 Ω/SQ.

4. A method according to claim 1, further comprised of depositing said fourth polycrystalline layer so that a portion of said second cell plate layer forms an electrical connection with a portion of said first cell plate layer.

5. A method according to claim 1, further comprised of depositing said fourth polycrystalline layer with one portion of said second cell plate layer adjoining one portion of said first cell plate layer.

6. A method according to claim 1, further comprised of forming said first, second, third and fourth polycrystalline layers above said semiconductor surface.

7. A method according to claim 1, further comprised of forming said first and second dielectric layers wholly above said semiconductor surface.

8. A method according to claim 1, further comprised of forming said first and second cell plate layers wholly above said semiconductor surface.

9. A method according to claim 1, further comprised of:
   forming said first, second, third and fourth polycrystalline layers above said semiconductor surface;
   forming said first cell plate layer wholly above said semiconductor surface;
   forming said first dielectric layer wholly above said semiconductor surface; and
   forming said second dielectric layer wholly above said semiconductor surface.

10. A method according to claim 4, further comprised of:
    forming said first, second, third and fourth polycrystalline layers above said semiconductor surface;
    forming said first cell plate layer wholly above said semiconductor surface;
    forming said first dielectric layer wholly above said semiconductor surface; and
    forming said secon dielectric layer wholly above said semiconductor surface.

11. A method for making a semiconductor memory cell, said method comprising the steps of:
    forming a thick field oxide layer on a portion of a surface of a semiconductor substrate having a first type conductivity;
    forming drain region of a second type conductivity and a source region of said second type conductivity, with one of said drain region and source region being adjacent to the field oxide layer on said semiconductor substrate surface, said source and drain regions being separated through a N channel region;
    forming a gate oxide layer above said drain region, said source region and said channel region;
    forming an electrically conductive strip from a first conductive polycrystalline silicon layer on the upper portion of said channel region;
    forming a first insulating layer, a first cell plate layer, a first dielectric layer, and a second polycrystalline silicon layer above exposed portions of said electrically conductive strip, said gate oxide layer and said field oxide layer;
    forming a contact hole within the first insulating layer, the first cell plate layer, the first dielectric layer, and the second polycrystalline silicon layer to expose said source region;
    forming side wall-insulating layers defined by side walls of said contact hole, said side wall-insulating layers extending vertically from said exposed source region to isolate said first cell plate layer from said exposed source region;
    forming a third polycrystalline silicon layer on said exposed source region and said side wall-insulating layer in order to connect said exposed source region with said second polycrystalline silicon layer;
    forming a second dielectric layer on a surface of exposed portions of said first dielectric layer after removing portions of said second and third polycrystalline silicon layers and exposed portions of said second and third polycrystalline silicon layers, in order to define a cell storage node layer formed by said second and third polycrystalline silicon layers; and
    forming a second cell plate layer of a fourth polycrystalline silicon layer on an upper portion of said second dielectric layer.

12. A method according to claim 11, wherein said first and second dielectric layers are formed of either three layers of silicon oxide, silicon nitride and silicon oxide, or two layers of silicon nitride and silicon oxide.

13. A method according to claim 11, wherein said first, second, third and fourth polycrystalline layers are small resistance-layers of approximately 100 $\Omega/SQ$.

14. A method according to claim 11, further comprised of depositing said fourth polycrystalline layer with a portion of said second cell plate layer forming an electrical connection with a portion of said first cell plate layer.

15. A method according to claim 11, further comprised of depositing said fourth polycrystalline layer with one portion of said second cell plate layer adjoining one portion of said first cell plate layer.

16. A method according to claim 2, further comprised of forming said first, second, third and fourth polycrystalline layers above said semiconductor surface.

17. A method according to claim 11, further comprised of:
    forming said first, second, third and fourth polycrystalline layers above said semiconductor surface;
    forming said first cell plate layer wholly above said semiconductor surface;
    forming said first dielectric layer wholly above said semiconductor surface; and
    forming said second dielectric layer wholly above said semiconductor surface.

18. A method according to claim 14, further comprised of:
    forming said first, second, third and fourth polycrystalline layers above said semiconductor surface;
    forming said first cell plate layer wholly above said semiconductor surface;
    forming said first dielectric layer wholly above said semiconductor surface; and
    forming said second dielectric layer wholly above said semiconductor surface.

19. A method for making a semiconductor memory cell, comprising the steps of:
    forming a gate oxide layer on a portion of a surface of a semiconductor substrate having a first type conductivity;
    forming an electrically conductive strip from a first conductive polycrystalline silicon layer disposed on said gate oxide layer above a channel region within said semiconductor substrate;
    forming a first insulating layer, a first cell plate layer, a first dielectric layer, and a second polycrystalline silicon layer above said electrically conductive strip, and said gate oxide layer;
    forming a contact hole within the first insulating layer, the first cell plate layer, the first dielectric layer, and the second polycrystalline silicon layer to provide an exposed area of said surface of the semiconductor substrate;
    forming side-wall insulating layers defined by side walls of said contact hole, said side-wall insulating layers extending from said exposed area for separating said first cell plate layer from said exposed area;

forming a third polycrystalline silicon layer on said exposed area and said side-wall insulating layers;

forming a second dielectric layer on a surface of the first cell plate layer after removing portions of said first and second polycrystalline silicon layers and said first dielectric layer, and on exposed portions of said first and second polycrystalline silicon layers;

forming a second cell plate layer on said second dielectric layer with a portion of said second cell plate layer forming an electrical contact with a portion of said first cell plate layer.

* * * * *

UNITED STATES PATENT AND TRADEMARK OFFICE
CERTIFICATE OF CORRECTION

Page 1 of 2

PATENT NO. : 5,166,090
DATED : 24 November 1992
INVENTOR(S) : Kyong-Tae KIM, et al.

It is certified that error appears in the above-indentified patent and that said Letters Patent is hereby corrected as shown below:

IN THE ABSTRACT

Line 4, before "steps of", insert --the--;

Line 8, after "surface", insert --of--, and after "drain", insert --said--;

Line 11, before "field", change "said" to --the--;

Column 2, Line 27, before "transistor", change "MOS" to

--metal oxide semiconductor--;

Column 3, Line 13, after "sequence", change "of" to -- of; --;

UNITED STATES PATENT AND TRADEMARK OFFICE
CERTIFICATE OF CORRECTION

PATENT NO. : 5,166,090
DATED : 24 November 1992
INVENTOR(S) : Kyong-Tae KIM, et al.

It is certified that error appears in the above-indentified patent and that said Letters Patent is hereby corrected as shown below:

IN THE CLAIMS

Column 4,　　Line 11,　　after "having", change "an" to -- a --;

Line 16,　　after "forming", change "an" to -- a --, and after "with", change "an" to -- a --;

Column 5,　　Line 28,　　before " dielectric", change "secon" to --second--;

Signed and Sealed this

Seventeenth Day of September, 1996

Attest:

BRUCE LEHMAN

*Attesting Officer*　　　　*Commissioner of Patents and Trademarks*